(12) United States Patent
Chean

(10) Patent No.: US 9,312,107 B1
(45) Date of Patent: Apr. 12, 2016

(54) DISK HANDLING APPARATUS AND METHOD FOR SUPPORTING A DISK DURING MATERIAL DEPOSITION AT A DEPOSITION STATION

(75) Inventor: Khoon H. Chean, Bayan Lepas (MY)

(73) Assignee: WD Media, LLC, San Jose, CA (US)

( * ) Notice: Subject to any disclaimer, the term of this patent is extended or adjusted under 35 U.S.C. 154(b) by 466 days.

(21) Appl. No.: 13/076,949

(22) Filed: Mar. 31, 2011

(51) Int. Cl.
*C23C 14/50* (2006.01)
*H01J 37/32* (2006.01)

(52) U.S. Cl.
CPC .......... *H01J 37/32715* (2013.01); *C23C 14/50* (2013.01)

(58) Field of Classification Search
CPC ............ H01J 37/32715; H01J 37/3438; H01J 37/3411; H01J 37/34; C23C 14/50
USPC .......... 204/298.15, 192.12; 118/500
See application file for complete search history.

(56) References Cited

U.S. PATENT DOCUMENTS

| | | | | |
|---|---|---|---|---|
| 5,004,399 | A | * | 4/1991 | Sullivan et al. ............... 414/729 |
| 5,244,555 | A | * | 9/1993 | Allen et al. ................. 204/192.2 |
| 5,273,588 | A | * | 12/1993 | Foster et al. ............. 118/723 E |
| 5,292,222 | A | | 3/1994 | Malagrino, Jr. et al. |
| 5,543,022 | A | * | 8/1996 | Nguyen et al. .......... 204/298.15 |
| 5,647,626 | A | | 7/1997 | Chen et al. |
| 5,765,890 | A | | 6/1998 | Gaylord et al. |
| 5,765,983 | A | | 6/1998 | Caveney et al. |
| 5,847,823 | A | * | 12/1998 | Imaino et al. .............. 356/243.1 |
| 5,938,902 | A | | 8/1999 | Nguyen et al. |
| 6,164,899 | A | | 12/2000 | Burg et al. |
| 6,467,827 | B1 | | 10/2002 | Ardezzone |
| 6,869,266 | B2 | | 3/2005 | Coomer et al. |
| 6,893,069 | B1 | | 5/2005 | Graham |
| 2006/0157998 | A1 | | 7/2006 | Gershenzon et al. |
| 2007/0215049 | A1 | | 9/2007 | Aderhold et al. |
| 2009/0096229 | A1 | | 4/2009 | Bonora et al. |

FOREIGN PATENT DOCUMENTS

| | | | |
|---|---|---|---|
| JP | 06-168445 | * | 6/1994 |
| JP | 09-188375 | * | 7/1997 |
| JP | 2001-357594 | * | 12/2001 |

OTHER PUBLICATIONS

Machine Translation JP 2001-357594 dated Dec. 2001.*
Machine Translation JP 06-168445 dated Jun. 1994.*
Machine Translation of JP 09-188375 dated Jul. 1997.*

* cited by examiner

*Primary Examiner* — Rodney McDonald

(57) ABSTRACT

A disk handling apparatus for supporting a disk during material deposition at a deposition station, comprising a disk vacuum paddle having a centrally disposed groove, and a vacuum source disposed within the groove, wherein the paddle contacts the disk only at disk corners on opposing major surfaces of the disk, and wherein the disk remains spaced from the groove at its outer diameter during material deposition.

14 Claims, 3 Drawing Sheets

DISK HANDLING APPARATUS AND METHOD FOR SUPPORTING A DISK DURING MATERIAL DEPOSITION AT A DEPOSITION STATION

FIELD OF THE INVENTION

The present invention generally relates to magnetic recording and, in particular, relates to a disk handling apparatus and method for supporting a disk during material deposition at a deposition station.

BACKGROUND

During fabrication of thin-film magnetic recording disks, the disks must be protected from physical damage that may occur as the discs are being handled. A disk typically travels through a series of sputtering chambers, or deposition stations, for deposition of successive layers onto the disk. In one type of sputtering apparatus, the disk is transferred between sputtering stations using a walking beam arrangement. The disk is balanced in a holder having a series of V-shaped receivers arranged to receive and support the disk in a vertical position between opposing sputtering targets, for layer deposition on opposite sides of the disk. The groove width and depth of such V-shaped receivers is typically between 90°-130°. The V-shaped receivers must be deep enough to provide stable disk seating, and wide enough to present a substantial landing zone for the disk as it is transferred in and out of the holder.

FIG. 1 (prior art) is a cross-sectional view depicting a conventional disk handling apparatus 10 for supporting a disk 70 during material deposition at a deposition station. Specifically, conventional disk handling apparatus 10 comprises a disk vacuum paddle 20 having a centrally disposed groove 30, and a vacuum source 40 providing a suction force at the base 50 of the groove 30 in the direction of arrow 60. In this type of paddle configuration, the paddle 20 contacts the disk 70 on the outer diameter of the disk 70 at the base 50 of the groove 30 such that there is substantial contact between the paddle 20 and outer diameter as vacuum suction is applied. The large disk contact area causes disk particles to accumulate in the groove 30, and the accumulated particles contaminate the disk 70 and damage the outer diameter. Accordingly, the disk 70 does not remain spaced from the base 50 of the groove 30 at its outer diameter during material deposition. In addition, the groove angle varies from 20 degrees near the base 50 of the groove 30 to about 80 degrees further away from the groove 30 near the top of the paddle 20. As depicted at arrow 80, damage can be inflicted on the major surfaces of the disk 70 during operation when the disk 70 is not aligned parallel within the groove 30. The conventional disk vacuum paddle comprises VESPEL, which is expensive and must be replaced during routine maintenance.

DETAILED DESCRIPTION

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail to avoid unnecessarily obscuring the present invention.

Embodiments of the present invention are directed toward a disk handling apparatus for supporting a disk during material deposition at a deposition station, comprising a disk vacuum paddle having a centrally disposed groove, and a vacuum source disposed within the groove, wherein the paddle contacts the disk only at disk corners on opposing major surfaces of the disk, and wherein the disk remains spaced from the groove at its outer diameter during material deposition.

In some embodiments, the paddle comprises a two-piece design including a top portion and a bottom portion, wherein the top and bottom portions are separated to facilitate replacing the groove, and wherein the top and bottom portions are attached together using at least one guide pin and at least one locking screw. In certain implementations, an O-ring seal is disposed between the top and bottom portions to prevent leakage. Additionally, in some embodiments, the top portion is formed of a different material than the bottom portion. By way of example, the top portion may be formed of VESPEL, while the bottom portion may be formed of aluminum.

In some configurations of the disk vacuum paddle, a base the groove includes a groove angle between 30 degrees and 50 degrees with respect to the major surfaces of the disk. In other configurations, the base the groove includes a groove angle between 35 degrees and 45 degrees with respect to the major surfaces of the disk. In further configurations, the base the groove includes a groove angle of about 40 degrees with respect to the major surfaces of the disk. In some embodiments, an upper portion of the groove forms an angle of about 40 degrees with respect to the major surfaces of the disk.

Further embodiments of the invention are directed toward a method for supporting a disk during material deposition at a deposition station, comprising providing a disk vacuum paddle having a centrally disposed groove, providing a vacuum source disposed within the groove, inserting the disk within the disk paddle and proceeding with material deposition, and contacting the disk with the disk paddle only at disk corners on opposing major surfaces of the disk, wherein the disk remains spaced from the groove at its outer diameter during material deposition.

Figures 1, 2:
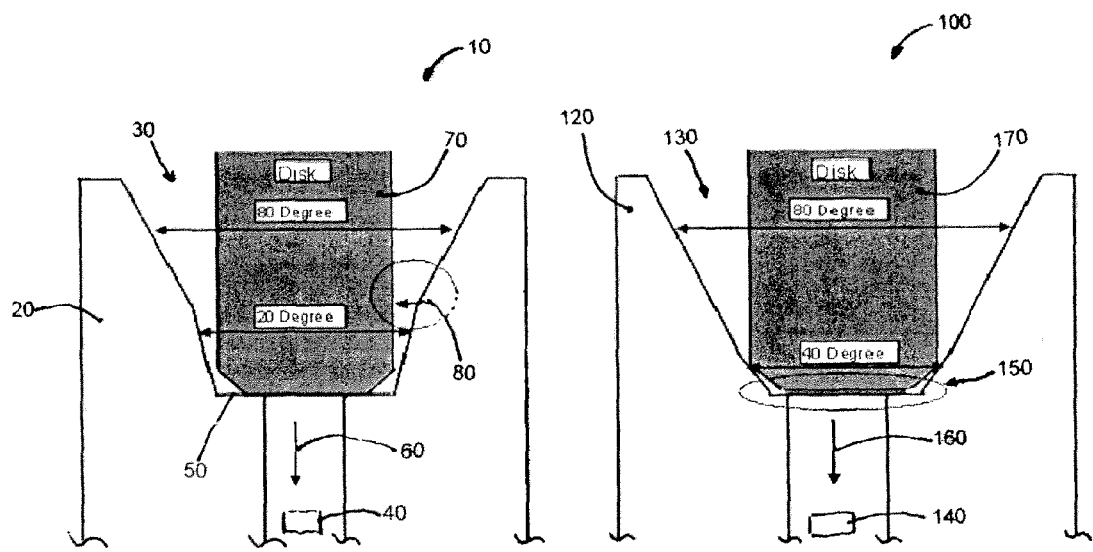
FIG. 1 (prior art) is a cross-sectional view depicting a conventional disk handling apparatus for supporting a disk during material deposition at a deposition station.
FIG. 2 is a cross-sectional view depicting a disk handling apparatus for supporting a disk during material deposition at a deposition station, in accordance with an embodiment of the present invention.

FIG. 2 is a cross-sectional view depicting a disk handling apparatus 100 for supporting a disk 170 during material deposition at a deposition station, in accordance with an embodiment of the present invention. In particular, disk handling apparatus 100 comprises a disk vacuum paddle 120 having a centrally disposed groove 130, and a vacuum source 140 providing a suction force at the base 150 of the groove 130 in the direction of arrow 160. In the illustrated embodiment, the disk 170 remains spaced from the base 150 of the groove 130 at its outer diameter during material deposition. By way of non-limiting example, the disk's outer diameter may be 65 mm or 95 mm.

The disk vacuum paddle groove 130 reduces disk surface contact, yet maintains the same level of vacuum suction and pull force as the conventional design paddle 20 of FIG. 1. More particularly, the groove 130 of the disk vacuum paddle 120 contacts the disk 170 only at disk corners on the opposing major surfaces where the disk tapers towards the outer diameter. Accordingly, there are only line contacts with the disk 170 forming a seal rather than surface contacts, and the disk 170 remains spaced from the groove 130 at the outer diameter (at the base 150 of the groove 130). As a result, fewer particles accumulate in the groove 130 which reduces disk contamination and damage. This is in contrast to the conventional apparatus 100 of FIG. 1 in which there is substantial contact between the paddle 120 and outer diameter during operation.

With further reference to FIG. 2, the groove angle in this embodiment near the base 150 of the groove 130 has been increased to between about 30 degrees and 50 degrees, preferably between about 35 degrees and 45 degrees, most preferably about 40 degrees. The increased groove angle provide a wider angle away from the disk surface where the paddle 120 is not parallel to the disk 170. The groove angle remains about 80 degrees further away from the groove 130 near the top of the paddle 120.

Figure 3:
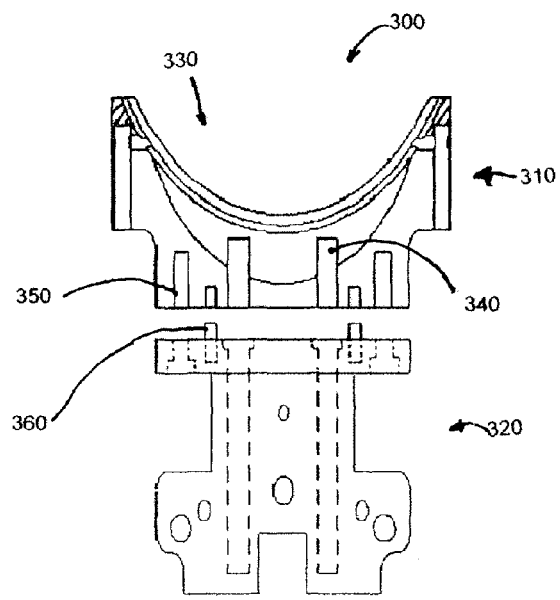
FIG. 3 is a cross-sectional view depicting a two-piece disk handling apparatus for supporting a disk during material deposition at a deposition station, in accordance with an embodiment of the present invention.

FIG. 3 is a cross-sectional view depicting a two-piece disk handling apparatus 300 for supporting a disk during material deposition at a deposition station, in accordance with an embodiment of the present invention. In the illustrated embodiment, the paddle 310, 320 comprises a two-piece design including a top portion 310 and a bottom portion 320, wherein the top and bottom portions 310, 320 are separated to facilitate replacing the groove 330. Vacuum suction is provided in the groove 330 by way of one or more vacuum apertures 340. As depicted, the top and bottom portions 310, 320 can be attached together using at least one guide pin 360 and at least one locking screw 350. In certain implementations, an O-ring seal is disposed between the top and bottom portions 310, 320 to prevent leakage. Additionally, in some embodiments, the top portion 310 is formed of a different material than the bottom portion. By way of example, the top portion 310 may be formed of VESPEL, while the bottom portion 320 may be formed of aluminum.

Figure 4:
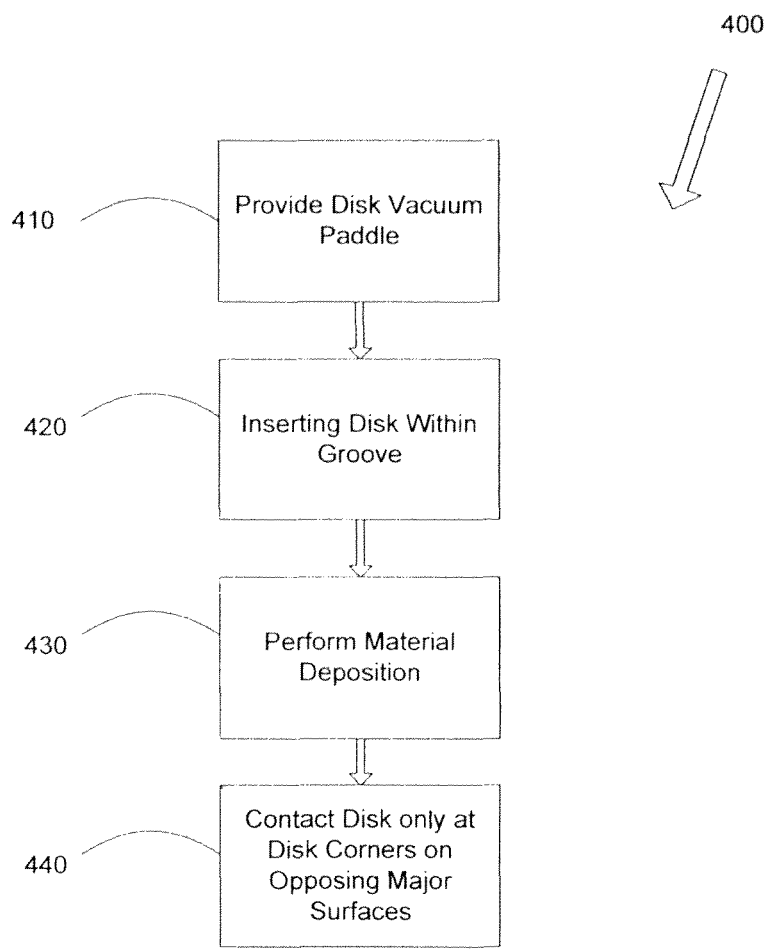
FIG. 4 is a flowchart illustrating a method for supporting a disk during material deposition at a deposition station, in accordance with an embodiment of the invention.

FIG. 4 illustrates a method 400 for supporting a disk during material deposition at a deposition station, in accordance with an embodiment of the invention. In particular, the method 400 starts with operation 410 comprising providing a disk vacuum paddle having a centrally disposed groove and a vacuum source disposed within the groove. Operation 420 entails inserting the disk within the disk paddle groove. Next, operation 440 comprises performing material deposition. Operation 440 entails contacting the disk with the disk paddle only at disk corners on opposing major surfaces of the disk, wherein the disk remains spaced from the groove at its outer diameter during material deposition.

Figure 5:
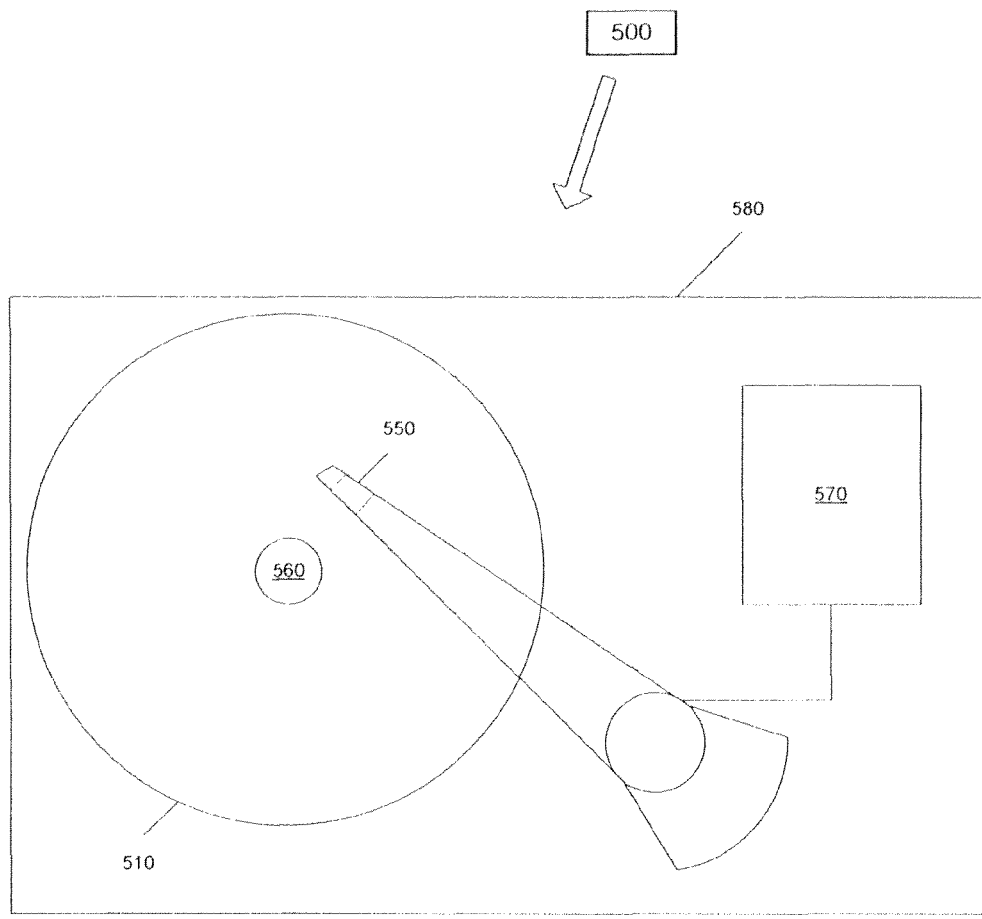
FIG. 5 is a diagram illustrating a disk drive including a perpendicular magnetic recording disk, in accordance with an embodiment of the present invention.

FIG. 5 illustrates a disk drive 500 having disk 510. Disk drive 500 may include one or more disks 510 to store data. Disk 510 resides on a spindle assembly 560 that is mounted to drive housing 580. Data may be stored along tracks in the magnetic recording layer of disk 510. The reading and writing of data is accomplished with head 550 that has both read and write elements. The write element is used to alter the properties of the perpendicular magnetic recording layer of disk 510. In one embodiment, head 550 may have magneto-resistive (MR), or giant magneto-resistive (GMR) elements. In an alternative embodiment, head 550 may be another type of head, for example, an inductive read/write head or a Hall effect head. The disk drive 500 may be a heat assisted magnetic recording (HAMR) drive and incorporate components of a laser source, a waveguide, and a near-field transducer (not depicted). Techniques in generating and focusing a laser beam are known in the art, and thus, are not described in particular detail. A spindle motor (not shown) rotates spindle assembly 560 and, thereby, disk 510 to position head 550 at a particular location along a desired disk track. The position of head 550 relative to disk 510 may be controlled by position control circuitry 570. The use of disk 510 fabricated in the manners discussed above may improve the performance of the perpendicular magnetic recording layer of disk 510 by providing a higher magnetic anisotropy from an $L1_0$-ordered recording layer. The use of disk 510 fabricated in the manners discussed above may also enable the use of $L1_0$-structured media on non-glass substrates.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

I claim:

1. A disk handling apparatus for supporting a disk during material deposition at a deposition station, comprising:
   a disk vacuum paddle having a centrally disposed groove; and
   a vacuum source disposed within the groove;
   wherein the paddle contacts the disk only at disk corners on opposing major surfaces of the disk; and
   wherein the disk remains spaced from the groove at its outer diameter during material deposition;
   wherein a groove angle of the groove increases from a base of the groove to an upper portion of the groove such that the groove angle is 40 degrees with respect to the major surfaces of the disk at the base of the groove and the groove angle is 80 degrees with respect to the major surfaces of the disk at an upper portion of the groove.

2. The apparatus of claim 1, wherein the paddle comprises a two-piece design including a top portion and a bottom portion.

3. The apparatus of claim 2, wherein the top and bottom portions are separated to facilitate replacing the groove.

4. The apparatus of claim 2, wherein the top and bottom portions are attached together using at least one guide pin and at least one locking screw.

5. The apparatus of claim 4, further comprising an O-ring seal disposed between the top and bottom portions to prevent leakage.

6. The apparatus of claim 2, wherein the top portion is formed of a different material than the bottom portion.

7. The apparatus of claim 2, wherein the bottom portion comprises aluminum.

8. A method for supporting a disk during material deposition at a deposition station, comprising:
   providing a disk vacuum paddle having a centrally disposed groove;
   providing a vacuum source disposed within the groove;
   inserting the disk within the disk paddle and proceeding with material deposition; and
   contacting the disk with the disk paddle only at disk corners on opposing major surfaces of the disk;

wherein the disk remains spaced from the groove at its outer diameter during material deposition;

wherein a groove angle of the groove increases from a base of the groove to an upper portion of the groove such that the groove angle is 40 degrees with respect to the major surfaces of the disk at the base of the groove and the groove angle is 80 degrees with respect to the major surfaces of the disk at an upper portion of the groove.

9. The method of claim 8, wherein the paddle comprises a two-piece design including a top portion and a bottom portion.

10. The method of claim 9, wherein the top and bottom portions are separated to facilitate replacing the groove.

11. The method of claim 9, wherein the top and bottom portions are attached together using at least one guide pin and at least one locking screw.

12. The method of claim 11, wherein an O-ring seal is provided between the top and bottom portions to prevent leakage.

13. The method of claim 9, wherein the top portion is formed of a different material than the bottom portion.

14. The method of claim 9, wherein the bottom portion comprises aluminum.

\* \* \* \* \*